United States Patent
Jung et al.

(10) Patent No.: US 9,154,140 B1
(45) Date of Patent: Oct. 6, 2015

(54) DELAY LOCKED LOOP

(71) Applicants: SK hynix Inc., Icheon (KR); INDUSTRY-ACADEMIC COOPERATION FOUNDATION, YONSEI UNIVERSITY, Seoul (KR)

(72) Inventors: Dong-Hoon Jung, Seoul (KR); Jin-Hyuk Kim, Jeollabuk-do (KR); Kyung-Ho Ryu, Seoul (KR); Seong-Ook Jung, Seoul (KR); Byoung-Chan Oh, Seoul (KR)

(73) Assignees: SK Hynix Inc., Icheon (KR); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/576,083

(22) Filed: Dec. 18, 2014

(30) Foreign Application Priority Data

Mar. 13, 2014 (KR) .................. 10-2014-0029623

(51) Int. Cl.
*H03L 7/06* (2006.01)
*H03L 7/081* (2006.01)
*H03L 7/08* (2006.01)

(52) U.S. Cl.
CPC ............... *H03L 7/0812* (2013.01); *H03L 7/08* (2013.01)

(58) Field of Classification Search
USPC .................................. 327/147–149, 156–158
See application file for complete search history.

(56) References Cited

U.S. PATENT DOCUMENTS

| | | | | |
|---|---|---|---|---|
| 6,741,109 | B1* | 5/2004 | Huang et al. | 327/156 |
| 7,692,496 | B2* | 4/2010 | Tseng | 331/11 |
| 7,983,370 | B2* | 7/2011 | Wada | 375/355 |
| 2009/0116315 | A1* | 5/2009 | Choi | 365/194 |
| 2010/0164566 | A1* | 7/2010 | Ku | 327/149 |
| 2012/0119801 | A1* | 5/2012 | Hsieh et al. | 327/156 |
| 2012/0126866 | A1* | 5/2012 | Hsieh et al. | 327/157 |
| 2013/0169337 | A1* | 7/2013 | Shin | 327/276 |
| 2015/0213873 | A1* | 7/2015 | Joo et al. | 365/154 |

FOREIGN PATENT DOCUMENTS

KR 10-2005-0101854 A 10/2005

* cited by examiner

*Primary Examiner* — Adam Houston (57) ABSTRACT

A delay locked loop includes a variable delay line circuit configured to delay a pulse selection circuit output to generate an output signal, a delay model circuit to delay the output signal to generate a first feedback signal, a first phase comparator circuit to control the variable delay line circuit according to the input signal and the first feedback signal, a pulse generation circuit to generate a pulse signal according to the input signal and the first feedback signal, a pulse retainer circuit to delay the output signal to generate a second feedback signal, a pulse selection circuit to select the pulse signal generated by the pulse generation circuit or the second feedback signal as the pulse selection circuit output during the tracking operation, and a second phase comparator circuit to control the variable delay line circuit according to the pulse selection circuit output and the output signal.

13 Claims, 12 Drawing Sheets

DELAY LOCKED LOOP

CROSS-REFERENCES TO RELATED APPLICATION

The present application claims priority under 35 U.S.C. §119(a) to Korean application number 10-2014-0029623, filed on Mar. 13, 2014, in the Korean Intellectual Property Office, which is herein incorporated by reference in its entirety.

BACKGROUND

1. Technical Field

Various embodiments generally relate to a delay locked loop, and more particularly, to a delay locked loop with a shorter tracking time.

2. Related Art

Figure 1:
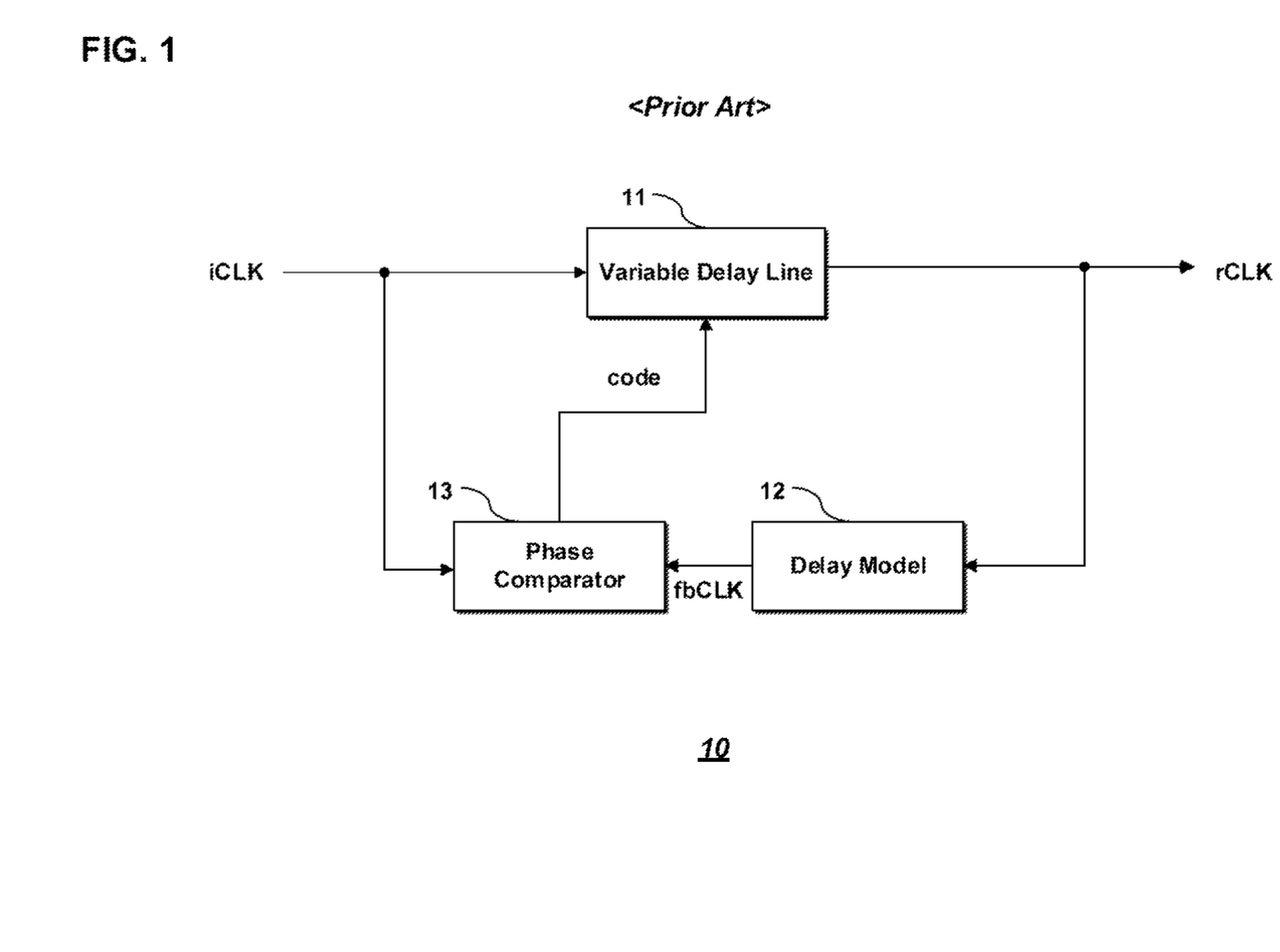
FIG. 1 is a block diagram showing a conventional delay locked loop.

FIG. 1 is a block diagram showing a conventional delay locked loop (DLL). The conventional delay locked loop 10 includes a variable delay line circuit 11 for adjusting a delay time of an input signal iCLK in response to a control signal code and generating an output signal rCLK, a delay model circuit 12 for delaying the output signal rCLK and outputting a feedback signal fbCLK, and a phase comparator circuit 13 for generating the control signal code based on a phase difference between the feedback signal fbCLK from the delay model circuit 12 and the input signal iCLK.

The conventional delay locked loop 10 executes a tracking operation to determine a delay amount of the variable delay line circuit 11 by initially performing several feedback operations. In the conventional delay locked loop 10, the signal rCLK outputted from the variable delay line circuit 11 is delayed by a given time, which is determined by the delay model circuit 12, before being transmitted to the phase comparator circuit 13. Several feedback operations are performed to complete the tracking operation, and the delay of the delay model circuit 12 accumulates as the several feedback operations are performed. As a result, the tracking time increases.

SUMMARY

Various embodiments are directed to providing a delay locked loop capable of performing a tracking operation in less time.

A delay locked loop according to an embodiment locks delays between an input signal and an output signal and includes a variable delay line circuit suitable for delaying the input signal to generate the output signal, a delay model circuit suitable for delaying the output signal to generate a first feedback signal, a first phase comparator circuit suitable for controlling a delay of the variable delay line circuit depending on a phase difference between the input signal and the first feedback signal, a pulse generation circuit suitable for generating a pulse signal in response to the input signal and the first feedback signal during tracking operation, a pulse retainer circuit suitable for delaying the output signal of the variable delay line circuit to generate a second feedback signal during the tracking operation, a pulse selection circuit suitable for selecting the pulse signal generated by the pulse generation circuit or the second feedback signal to provide the selected signal to the variable delay line circuit as the input signal during the tracking operation, and a second phase comparator circuit suitable for generating a delay control signal to control a delay of the variable delay line circuit depending on a phase difference between the signal selected by the pulse selection circuit and the output signal during the tracking operation.

In a delay locked loop according to an embodiment, a pulse width of the pulse signal is a sum of (i) the phase difference between the first feedback signal and the input signal and (ii) an initial delay of the variable delay line circuit.

In a delay locked loop according to an embodiment, the pulse generation circuit forms a rising edge of the pulse signal on a rising edge of the first feedback signal and forms a falling edge of the pulse signal on a point which is delayed by the initial delay of the variable delay line circuit from a falling edge of the input signal.

In a delay locked loop according to an embodiment, the pulse selection circuit selects an output of the pulse generation circuit shortly after the pulse signal is generated by the pulse generation circuit, and the pulse selection circuit selects the second pulse signal when the pulse signal is subject to feedback as the second feedback signal.

In a delay locked loop according to an embodiment, the second phase comparator completes the tracking operation when a falling edge of the input signal of the variable delay line circuit is aligned to a rising edge of the output signal.

A delay locked loop according to an embodiment may further includes a duty ratio control circuit suitable for controlling a duty ratio of a signal generated by the variable delay line circuit to provide the controlled signal as the output signal.

In an embodiment, the duty ratio control circuit may include an edge combiner circuit suitable for combining an output of the pulse retainer circuit and the output of the variable delay line circuit to generate the output signal, and a third phase comparator circuit suitable for controlling a delay of the pulse retainer circuit depending on a phase difference between the output signal and second feedback signal.

A delay locked loop according to an embodiment can shorten the time necessary for tracking operation.

DETAILED DESCRIPTION

Hereinafter, a delay locked loop according to an embodiment will be described below with reference to the accompanying drawings. The same reference numerals denote the same or the like features.

Figure 2:
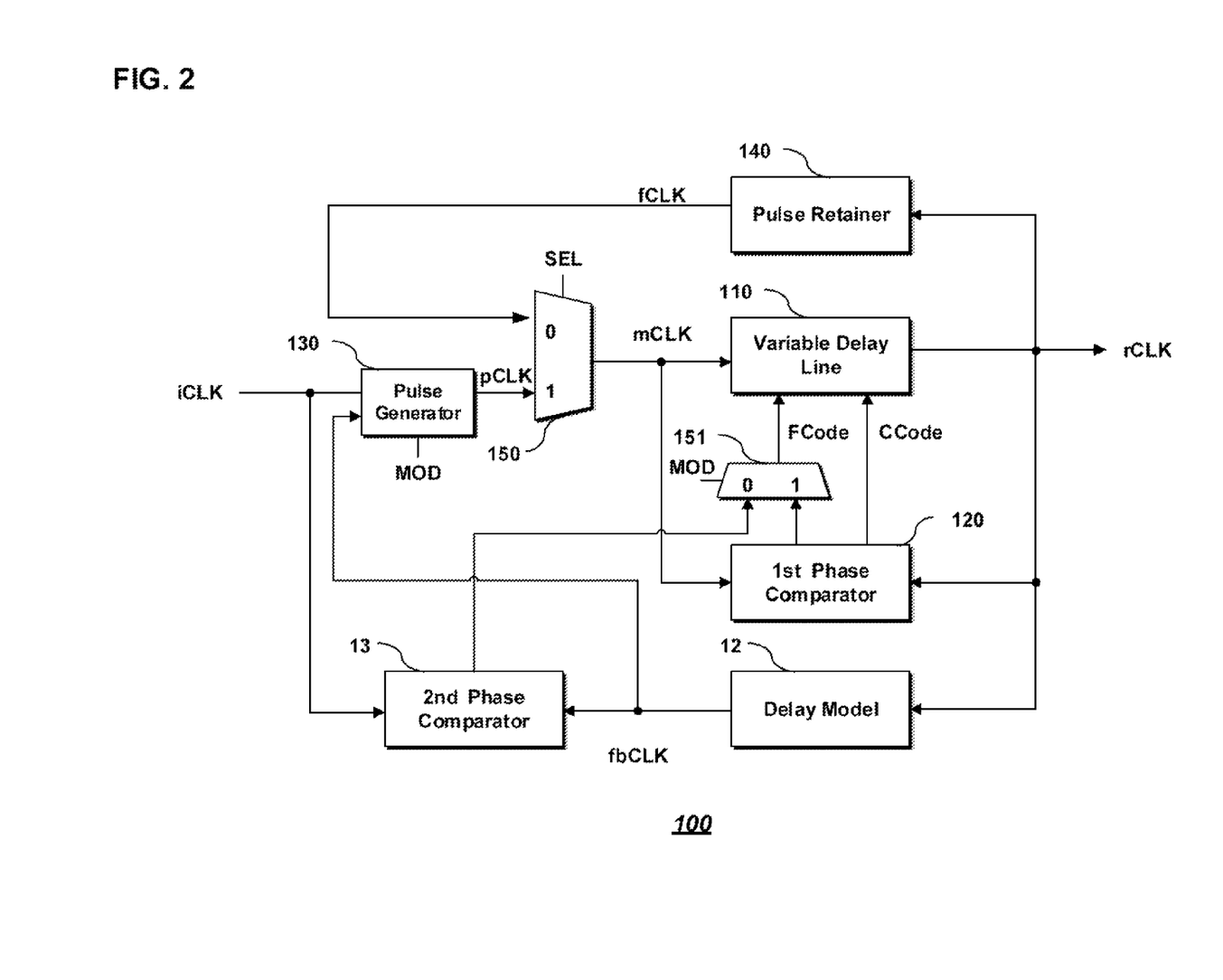
FIG. 2 is a block diagram showing a delay locked loop according to an embodiment.

FIG. 2 is a block diagram showing a delay locked loop (DLL) according to an embodiment. The delay locked loop 100 includes a variable delay line circuit 110, a first phase comparator circuit 120, a pulse generator circuit 130, a pulse retainer circuit 140, a pulse selection circuit 150, a delay control signal selection circuit 151, a delay model circuit 12, and a second phase comparator circuit 13.

The delay model circuit 12, the second phase comparator circuit 13, and the variable delay line circuit 110 operate in such a manner similar to those included in the conventional delay locked loop shown in FIG. 1. The pulse generator circuit 130 generates a pulse signal pCLK in response to an input signal iCLK and a first feedback signal fbCLK. The pulse generator circuit 130 generates a pulse signal mCLK at an initial stage of a tracking operation. That is, at the initial stage of the tracking operation to determine a delay amount of the variable delay line circuit 110, the pulse signal pCLK output from the pulse generator circuit 130 is selected by a selection signal SEL and provided as the pulse signal mCLK.

Figure 3:
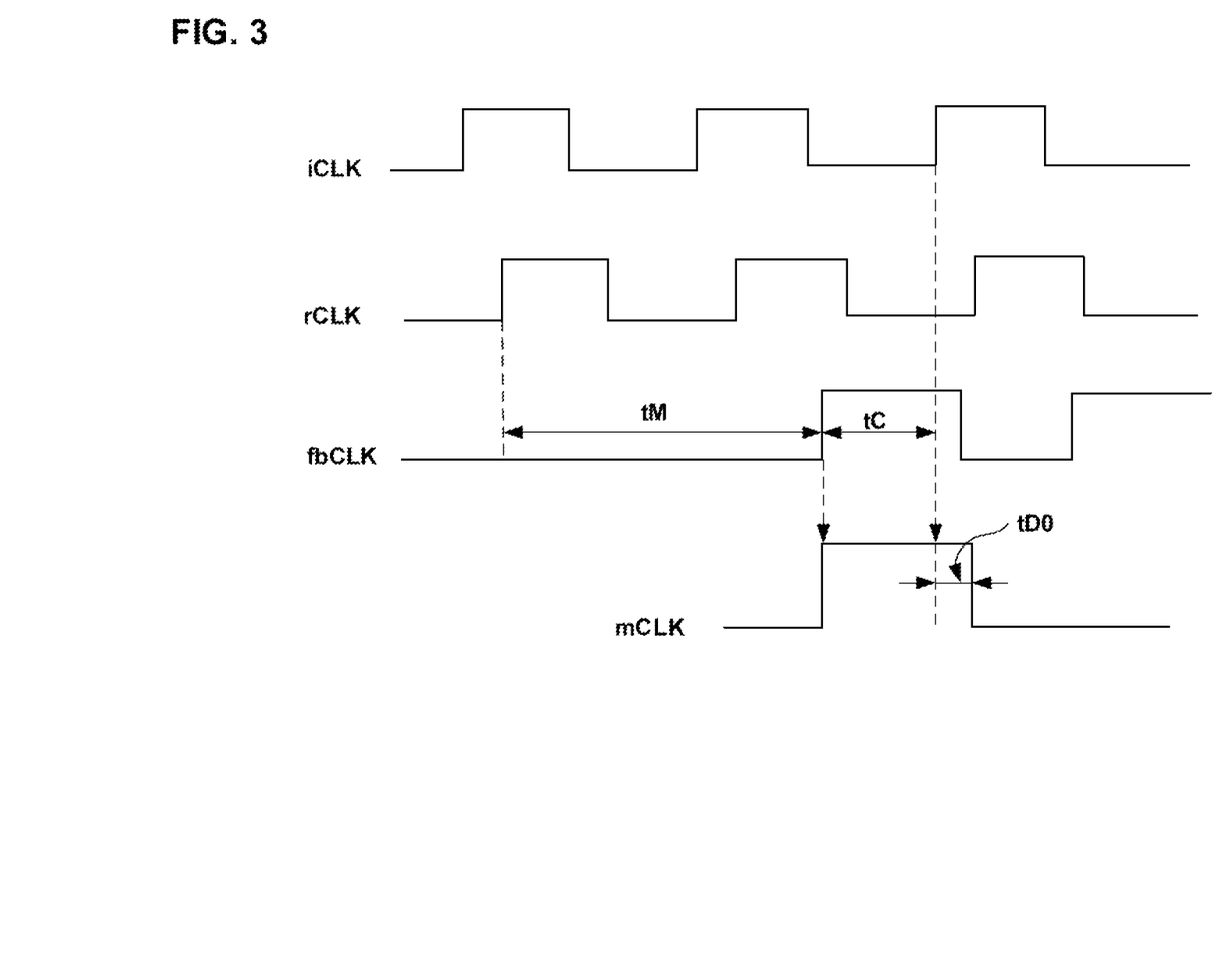
FIG. 3 is a waveform diagram illustrating an operation of a pulse generation circuit shown in FIG. 2.

Referring to FIG. 3, how the pulse signal mCLK at the initial stage of the tracking operation is generated from the pulse generator unit 130 will be described below. On the outset of operation of the delay locked loop 100, the output signal rCLK is generated after the input signal iCLK passes through the variable delay line circuit 110. The first feedback signal fbCLK is generated after the output signal rCKL passes through the delay model circuit 12, which has a modeled delay tM.

The tracking operation determines the delay amount of the variable delay line circuit 110, adjusting the delay amount so that a phase difference tC between the input signal iCLK and the first feedback signal fbCLK becomes zero '0'.

Referring to FIG. 3, a phase difference tM between the output signal rCLK and the first feedback signal fbCLK is fixed according to the delay model circuit 12. Thus, the phase difference tC between the input signal iCLK and the first feedback signal fbCLK can be made zero (0) by further increasing the delay amount of the variable delay line circuit 110 by the phase difference tC from an initial delay amount tD0 of the variable delay line circuit 110.

At the outset of the tracking operation, the pulse generator circuit 130 generates the pulse signal mCLK. The pulse signal mCLK includes a rising edge at a rising edge of the first feedback signal fbCLK. The pulse signal mCLK includes a falling edge at the point of time which is delayed by an amount equal to the initial delay tD0 from a rising edge of the input signal iCLK. When the tracking operation has completed, a pulse width of the pulse signal mCLK is the same as a delay amount of the variable delay line circuit 110.

Figure 4:
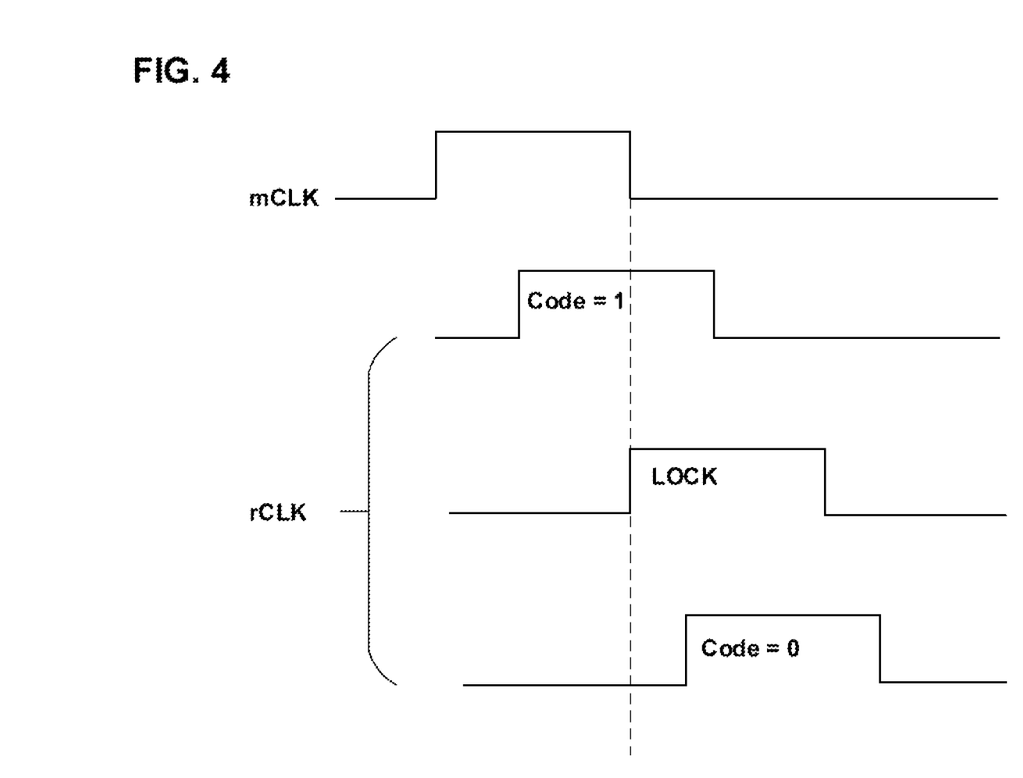
FIG. 4 is a waveform diagram illustrating a tracking operation by the delay locked loop shown in FIG. 2.

In a subsequent stage of the tracking operation, the pulse signal mCLK passes through the variable delay line circuit 110 and generates the output signal rCLK. Thus, according to an embodiment, as shown in FIG. 4, whether the tracking operation has completed, i.e., whether the DLL 100 is locked, can be determined by examining whether a falling edge of the pulse signal mCLK and a rising edge of the output signal rCLK coincide with each other. The first phase comparator circuit 120 compares the falling edge of the pulse signal mCLK and the rising edge of the output signal rCLK. If the rising edge of the output signal rCLK occurs before the falling edge of the pulse signal mCLK, the first phase comparator circuit 120 increases a value of a delay control signal provided to the variable delay line circuit 110 to thereby increase the delay amount of the variable delay line circuit 110. In the opposite case, i.e., if the rising edge of the output signal rCLK occurs after the falling edge of the pulse signal mCLK, the first phase comparator circuit 120 decreases the value of the delay control signal to reduce the delay amount of the variable delay line circuit 110.

Figure 5:
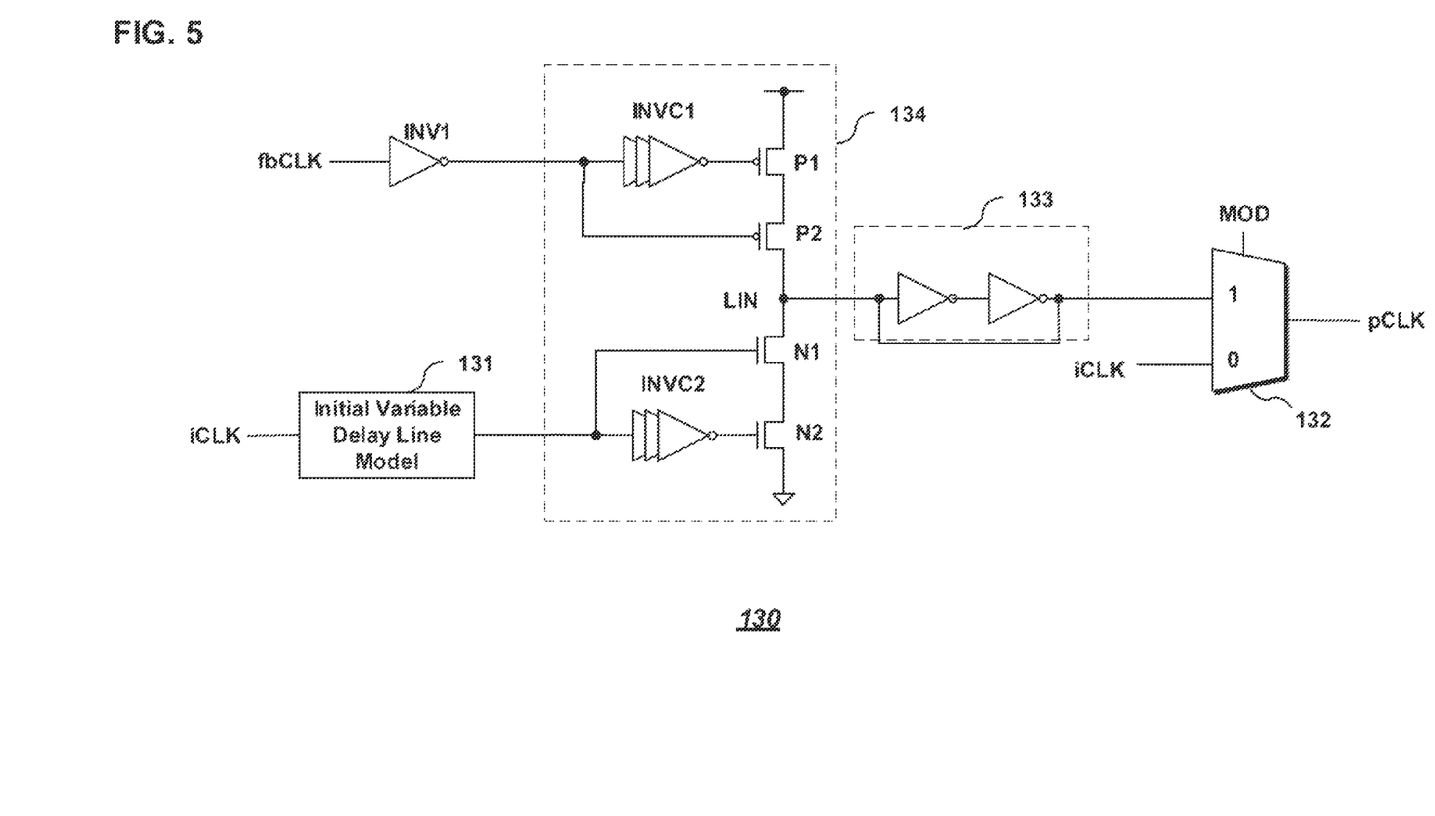
FIG. 5 is a block diagram showing the pulse generation circuit shown in FIG. 2.

FIG. 5 is a block diagram of the pulse generator circuit 130 shown in FIG. 2 according to an embodiment. The pulse generator circuit 130 includes an initial variable delay line model circuit 131 receiving the input signal iCLK, a driving circuit 134, a latch 133, and a selection circuit 132 outputting an output signal pCLK, which are coupled in series.

The first phase comparator circuit 120 sets a control signal MOD to '1' during the tracking operation, and sets the control signal MOD to '0' when the tracking operation completes. The control signal MOD is provided to the delay control signal selection circuit 151 shown in FIG. 2 and the selection circuit 132 of the pulse generator circuit 130. Thus, when the tracking operation completes, the selection circuit 132 selects and outputs the input signal iCLK as the output signal pCLK.

The driving circuit 134 includes first and second inverter chains INVC1 and INVC2, PMOS transistors P1 and P2 and NMOS transistors N1 and N2. The first inverter chain INVC1 is coupled to the first feedback signal fbCLK, and the second inverter chain INVC2 is coupled to the input signal iCLK through the initial variable delay line model circuit 131. Each of the first and second inverter chains INVC1 and INVC2 includes an odd number of inverters. The PMOS transistors P1 and P2 and the NMOS transistors N1 and N2 are coupled in series and disposed between a power supply voltage terminal and a ground voltage terminal.

During the tracking operation, the pulse generator circuit 130 generates the output signal pCLK by controlling the PMOS transistors P1 and P2 in response to the first feedback signal fbCLK which is transmitted through an inverter INV 1 and by controlling the NMOS transistors N1 and N2 in response to an output signal of the initial variable delay model circuit 131 that is generated based on the input signal iCLK. Due to the first inverter chain INVC1, signals transmitted to the PMOS transistors P1 and P2 have phases different from each other. For example, in a period of time before a rising edge of the first feedback signal fbCLK is transmitted, i.e., while the first feedback signal fbCLK is at a level 'low', the PMOS transistor P1 stays turned on and the PMOS transistor P2 stays turned off. Once the rising edge of the first feedback signal fbCLK is inputted, the PMOS transistor P2 turns on and, after a first period of time, the PMOS transistor P1 turns off. Due to a delay in the first inverter chain INVC1, the first period of time exists where both of the PMOS transistors P1 and P2 stay turned on. In this first period of time, a signal LIN is driven to a level 'high' and this information is stored in the latch 133.

Similar operation is performed with respect to the input signal iCLK. Specifically, shortly after a rising edge of the input signal iCLK is inputted and propagates through the initial variable delay line 131, a delay amount of the second inverter chain INVC2 results in a second period of time where both of the NMOS transistors N1 and N2 stay turned on at the same time. In this second period of time, the signal LIN is driven to a level 'low' and this information is stored in the latch 133. The initial variable delay model circuit 131 delays the input signal iCLK by the initial delay tD0 of the variable delay line circuit 110 and then generates a delayed signal that is provided to the second inverter chain INVC2 and a gate of the NMOS transistor N1. The output signal pCLK generated during the tracking operation operates as described above in reference to FIG. 3. Specifically, the output signal pCLK is a pulse signal that includes a rising edge at a rising edge of the first feedback signal fbCLK and a falling edge at a point of time which is delayed by the initial delay tD0 from a rising edge of the input signal iCLK, as shown in FIG. 3.

In the initial stage of the tracking operation, the first phase comparator circuit 120 shown in FIG. 2 activates the selection signal SEL so that the pulse selection circuit 150 selects the pulse signal pCLK, which is generated by the pulse generator circuit 130, as the pulse signal mCLK. In a subsequent stage of the tracking operation, the first phase comparator circuit 120 inactivates the selection signal SEL so that the pulse selection circuit 150 selects a second feedback signal fCLK which is a feedback signal from the pulse retainer circuit 140.

When the tracking operation completes, the first phase comparator circuit 120 activates the selection signal SEL so that the pulse selection circuit 150 selects the input signal iCLK, which is transmitted through the pulse generator circuit 130 due to the control signal MOD being set to 0 when the tracking operation completes, and thus provides the selected signal iCLK to the variable delay line circuit 110 as the pulse signal mCLK.

The first phase comparator circuit 120 may output a first delay control signal CCode and a second delay control signal FCode to control the variable delay line circuit 110. The first delay control signal CCode adjusts a delay amount of the variable delay line circuit 110 in a relatively large magnitude. The second delay control signal FCode adjusts the delay amount of the variable delay line circuit 110 in a relatively small magnitude. Thus, the first phase comparator circuit 120 may adjust the delay amount of the variable delay line circuit 110 in response to the first delay control signal CCode and then further adjusts the delay amount of the variable delay line circuit 110 more precisely in response to the second delay control signal FCode. When the tracking operation completes, the second phase comparator circuit 13 may adjust the delay of the variable delay line circuit 110 precisely. Thus, the delay control selection circuit 151 may select as the second delay control signal FCode in response to the control signal MOD one of the following signals: the signal from the first phase comparator circuit 120 and the signal from the second phase comparator circuit 13.

The pulse retainer circuit 140 generates the second feedback signal fCLK by feeding back the output signal rCLK of the variable delay line circuit 110. During the remaining stages of the tracking operation after the initial stage, since the pulse selection circuit 150 selects the second feedback signal fCLK as the pulse signal mCLK, the variable delay line circuit 110 receives the pulse signal mCLK generated using the pulse retainer circuit 140 and generates the output signal rCLK. The pulse retainer circuit 140 delays the output signal rCLK by a given time period (i.e. a delay tPR) and generates the delayed signal as the second feedback signal fCLK. It is desirable that the delayed time period (i.e. the delay tPR) is the same as or longer than the sum of the time period necessary for the first phase comparator circuit 120 to update the delay control signals CCode and FCode and the time period necessary to update the delay amount of the variable delay line circuit 110 in response to the updated delay control signals CCode and FCode.

The delayed time period of the pulse retainer circuit 140 is significantly shorter than the delay amount tM of the delay model circuit 12. Thus, the time consumed for the tracking operation may be reduced to be less than that of a conventional device.

Figure 6:
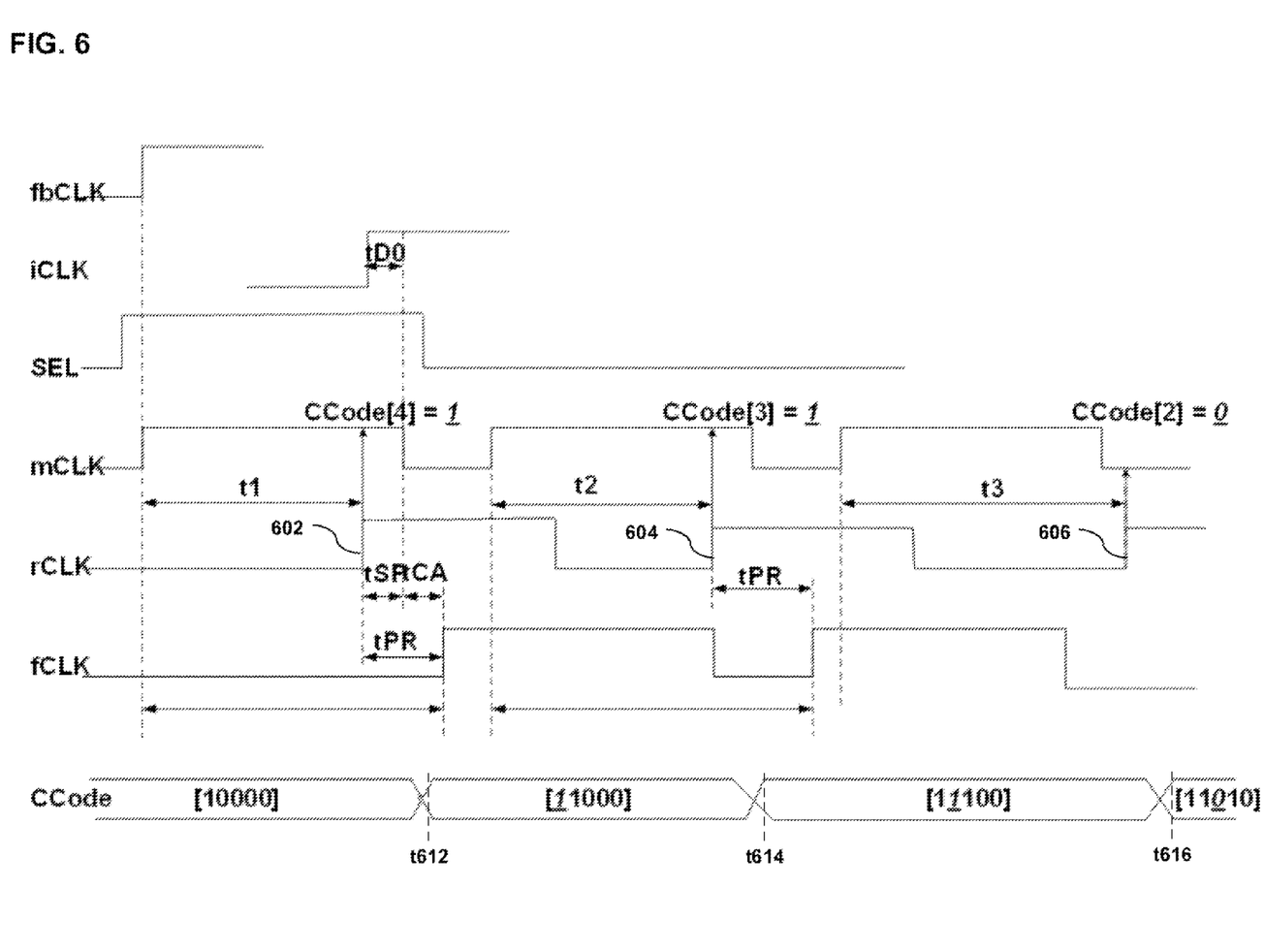
FIG. 6 is a waveform diagram for illustrating an operation of the delay locked loop shown in FIG. 2.

FIG. 6 is a waveform diagram for illustrating an operation of the delay locked loop 100 shown in FIG. 2. In an initial stage of a tracking operation, the pulse signal mCLK includes a rising edge synchronized with a rising edge of the first feedback signal fbCLK and a falling edge synchronized with the point of time delayed by the initial delay tD0 from a rising edge of the input signal iCLK. During the initial stage of the tracking operation, the selection signal SEL controlling the pulse selection circuit 150 is set to '1'. Thus, the pulse signal pCLK output from the pulse generator circuit 130 is provided as the pulse signal mCLK.

According to an embodiment, in the initial stage of the tracking operation, the first phase comparator circuit 120 initializes the first delay control signal CCode to '10000'. The variable delay line circuit 110 determines a delay amount t1 using the code value '10000'. The pulse signal mCLK is delayed by the delay amount t1 and generated as the output signal rCLK. At this time, the first phase comparator circuit 120 examines a level of the pulse signal mCLK at a rising edge of the output signal rCLK to set a new code value of the first delay control signal CCode.

In FIG. 6, the first delay control signal CCode is determined sequentially from a top bit based on a binary system, that is, from a fourth bit CCode[4] to a zero-th bit CCode[0]. However, a configuration of the variable delay line circuit 110 is not limited thereto and can be modified. Likewise, the process of determining the delay control signal FCode is not limited thereto and can be modified in various manners.

As shown in FIG. 6, the pulse signal mCLK of the first phase comparator circuit 120 has a value '1' at a first rising edge 602 of the output signal rCLK. This value '1' is set as the fourth bit of the first delay control signal CCode[4] to increase the delay amount of the variable delay line circuit 110. Before the fourth bit of the first delay control signal CCode[4] is set to the value '1', the previous value '1' of the fourth bit of the first delay control signal CCode[4] shifts to the third bit CCode[3]. As a result, at time t612 the first delay control signal CCode is updated with '11000' and the delay amount of the variable delay line circuit 110 is adjusted based on this updated value '11000'.

In a subsequent stage of the tracking operation, the pulse signal mCLK is generated from the second feedback signal fCLK which is transmitted through the pulse retainer circuit 140, rather than being generated from the signal transmitted through the pulse generator circuit 130. For this stage of the tracking operation, the selection signal SEL controlling the pulse selection circuit 150 is set to '0'. The pulse retainer circuit 140 generates a delayed version of the output signal rCLK as the second feedback signal fCLK. It is desirable that the delay amount tPR of the pulse retainer circuit 140 is the same as or more than the sum of a signal processing time tSP, which is necessary for the first phase comparator circuit 120 to update the first delay control signal CCode, and a time tCA, which is necessary for the delay amount of the variable delay line circuit 110 to be adjusted based on the updated first delay control signal CCode.

Subsequent stages of the tracking operation are performed in substantially the same manner described above. The variable delay line circuit 110 delays the pulse signal mCLK for a time period t2 determined based on the updated first delay control signal CCode '11000' to generate the output signal rCLK. The pulse retainer circuit 140 delays the output signal rCLK for a time period tPR to generate the second feedback signal fCLK. The second feedback signal fCLK is provided as a new pulse signal mCLK.

Subsequently, the first phase comparator circuit 120 sets the third bit of the first delay control signal CCode[3] to '1' because the pulse signal mCLK has a value '1' at a second rising edge 604 of the output signal rCLK. Ahead of setting the third bit of the first delay control signal CCode[3] to '1', the previous value '1' of the third bit of the first delay control signal CCode[3] shifts to the second bit CCode[2]. As a result, at time t614 the first delay control signal CCode is updated as '11100'. The delay amount of the variable delay line circuit 110 is adjusted accordingly. The variable delay line circuit 110 delays the pulse signal mCLK for a time period t3 determined based on the updated first delay control signal CCode '11100' to generate the output signal rCLK.

After that, the pulse retainer circuit 140 delays the output signal rCLK for the time period tPR to generate the second feedback signal fCLK. The second feedback signal fCLK is provided as an updated pulse signal mCLK. At this time, the first phase comparator circuit 120 examines a level of the updated pulse signal mCLK and sets the second bit of the first delay control signal CCode[2] to '0' because the pulse signal mCLK has the level 'low' at a third rising edge 606 of the output signal rCLK. Before this setting the second bit of the first delay control signal CCode[2] to '0', the previous value '1' of the second bit of the first delay control signal CCode[2] shifts to the first bit. As a result, at time t616 the first delay control signal CCode is updated as '11010'. The delay amount of the variable delay line circuit 110 is adjusted accordingly. After the first delay control signal CCode is determined in this manner, the second delay control signal FCode may be determined.

The first phase comparator circuit 120 may perform the tracking operation by sequentially increasing the second delay control signal FCode which has a minimum value as an initial value or by sequentially decreasing the second delay control signal FCode which has a maximum value as an initial value. Whether or not to increase or decrease the second delay control signal FCode may be determined depending on the level of the pulse signal mCLK at a rising edge of the output signal rCLK.

According to an embodiment, a tracking operation is controlled using a feedback loop transmitted through the pulse retainer circuit 140 which has a relatively short delay when compared to the delay of the delay model circuit 12. Thus, compared with a conventional DLL, the tracking operation according to the embodiment can be performed in a shorter time period.

Figure 7:
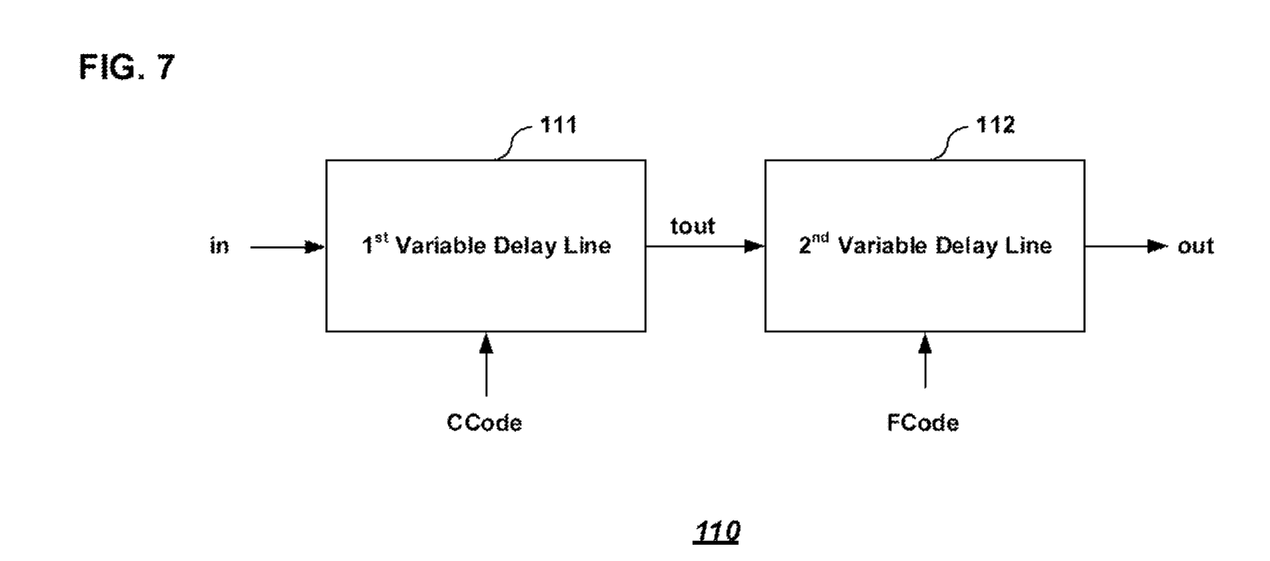
FIGS. 7, 8, and 9 are block diagrams for illustrating the structure of a variable delay line circuit included in the delay locked loop shown in FIG. 2.

FIG. 7 is a block diagram of the variable delay line circuit shown in FIG. 2. The variable delay line circuit 110 includes a first variable delay line circuit 111 and a second variable delay line circuit 112. The first variable delay line circuit 111 adjusts the delay amount by a relatively large magnitude in response to the first delay control signal CCode. The second variable delay line circuit 112 adjusts the delay amount by a relatively small magnitude in response to the second delay control signal FCode.

Figure 8:
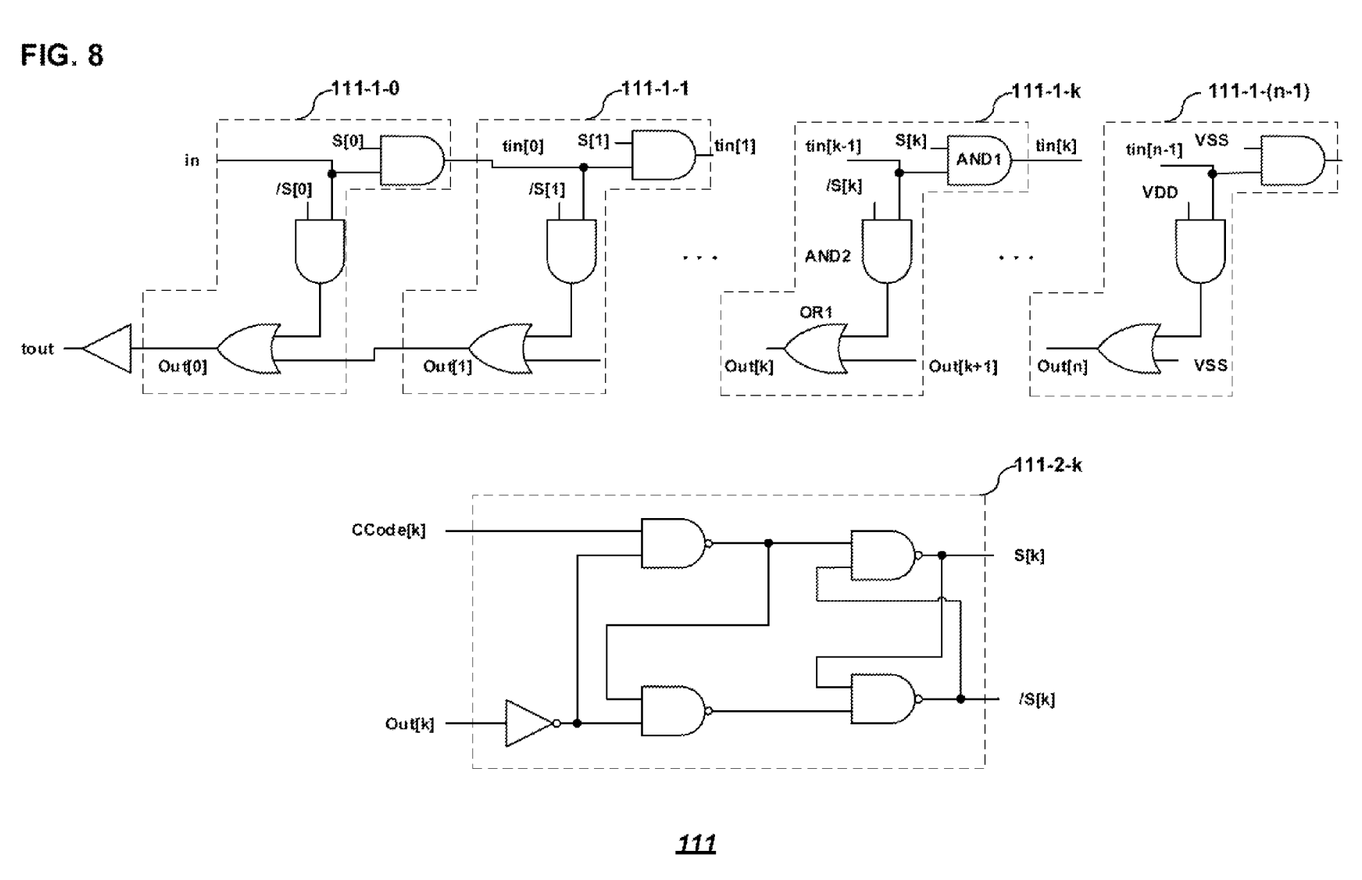

FIG. 8 is a block diagram of the first variable delay line circuit 111. The first variable delay line unit 111 includes a plurality of unit delay nodes 111-1-0 through 111-1-(n−1) and a plurality of latches 111-2-0 through 111-2-(n−1). Each of the unit delay nodes 111-1-k may propagate a signal tin [k−1], which is transmitted from a preceding node, to a next unit delay node 111-1-(k+1) as a signal tin[k] using a first AND gate AND1 in response to a control signal S[k]. In addition, each of the unit delay nodes 111-1-k may propagate an output OUT[k+1], which comes back from the next unit delay node 111-1-(k+1), as an output OUT[k] using an OR gate OR1. Each of the unit delay nodes 111-1-k also may propagate the signal tin[k−1] transmitted from the preceding node as the output OUT[k] using the OR gate OR1 and a second AND gate AND2 in response to a control signal /S[k]. Thus, when the control signal S[k]=1 and the control signal /S[k]=0, the unit delay nodes 111-1-k propagates the signal tin[k−1] to the signal tin[k] and propagates the output Out[k+1] to the output Out[k], and when the control signal S[k]=0 and the control signal /S[k]=1, the unit delay nodes 111-1-k propagates the signal tin[k−1] signal to the output Out[k]. For example, under the condition that the control signal S[0]=1, . . . , S[k−1]=1, and S[k]=0, it is established that the output OUT [k+1]= . . . =Out[n]=0. Thus, the delay amount of the variable delay line circuit 110 may be determined by the unit delay nodes 111-1 including the $0^{th}$ unit delay node 111-1-0 through the $k^{th}$ unit delay node 111-1-k.

The latches 111-2-0 through 111-2-(n−1) correspond to the unit delay nodes 111-1-0 through 111-1-(n−1), respectively. That is, each of the latches 111-2-k generates the control signals S[k] and /S[k] in response to a $k^{th}$ bit value of the first delay control signal CCode and the output OUT[k] of the corresponding unit delay node 111-1-k. When the output OUT[k] of the unit delay node 111-1-k has a value 'low', the latch 111-2-k sets the $k^{th}$ bit value of the first delay control signal CCode as the control signal S[k]. Under this configuration, the control signal S[k] is updated only after an input signal 'in' passes through every single unit delay nodes 111-1-k which are included in the first variable delay line circuit 111. Thus, a glitch can be minimized.

Figure 9:
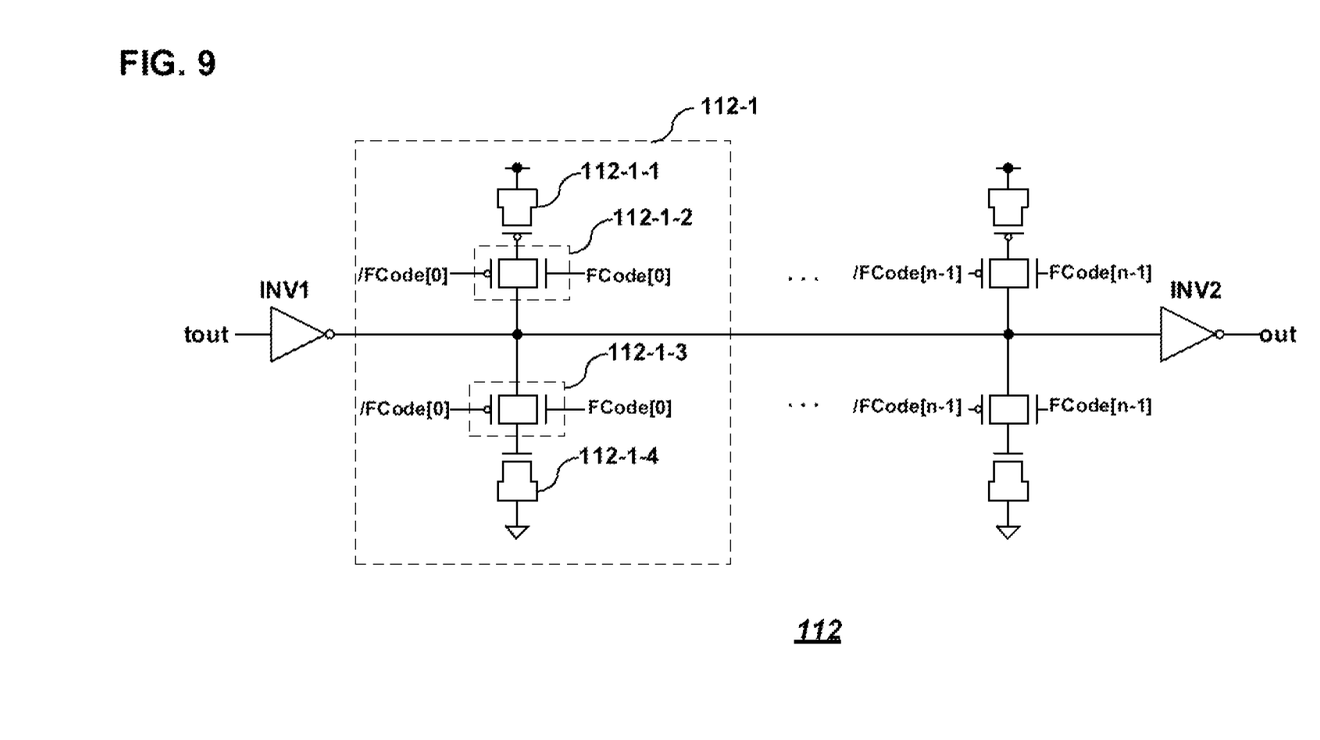

FIG. 9 is a block diagram of the second variable delay line circuit 112 shown in FIG. 7. The second variable delay line circuit 112 includes two inverters INV1 and INV2 and a plurality of adjustment circuits 112-1 which are connected in parallel to each other between the two inverters INV1 and INV2.

Each of the plurality of adjustment circuits 112-1 includes a first MOS capacitor 112-1-1, a first transmission gate 112-1-2, a second transmission gate 112-1-3, and a second MOS capacitor 112-1-4, which are coupled in series between a power supply voltage terminal and a ground voltage terminal. A coupling node of the first and second transmission gates 112-1-2 and 112-1-3 of each of the plurality of adjustment circuits 112-1 is connected to an output node of the first inverter INV1 and an input node of the second inverter INV2. The first and second transmission gates 112-1-2 and 112-1-3 of the plurality of adjustment circuits 112-1 are controlled by the second delay control signal FCode.

Each of the plurality of adjustment circuits 112-1 adjusts capacitance according to a bit value of the second delay control signal FCode. In an embodiment, as a value of the second delay control signal FCode increases, a capacitance value between the two inverters INV1 and INV2 increases as well. As a result, a delay amount of the second variable delay line circuit 112 increases.

Figure 10:
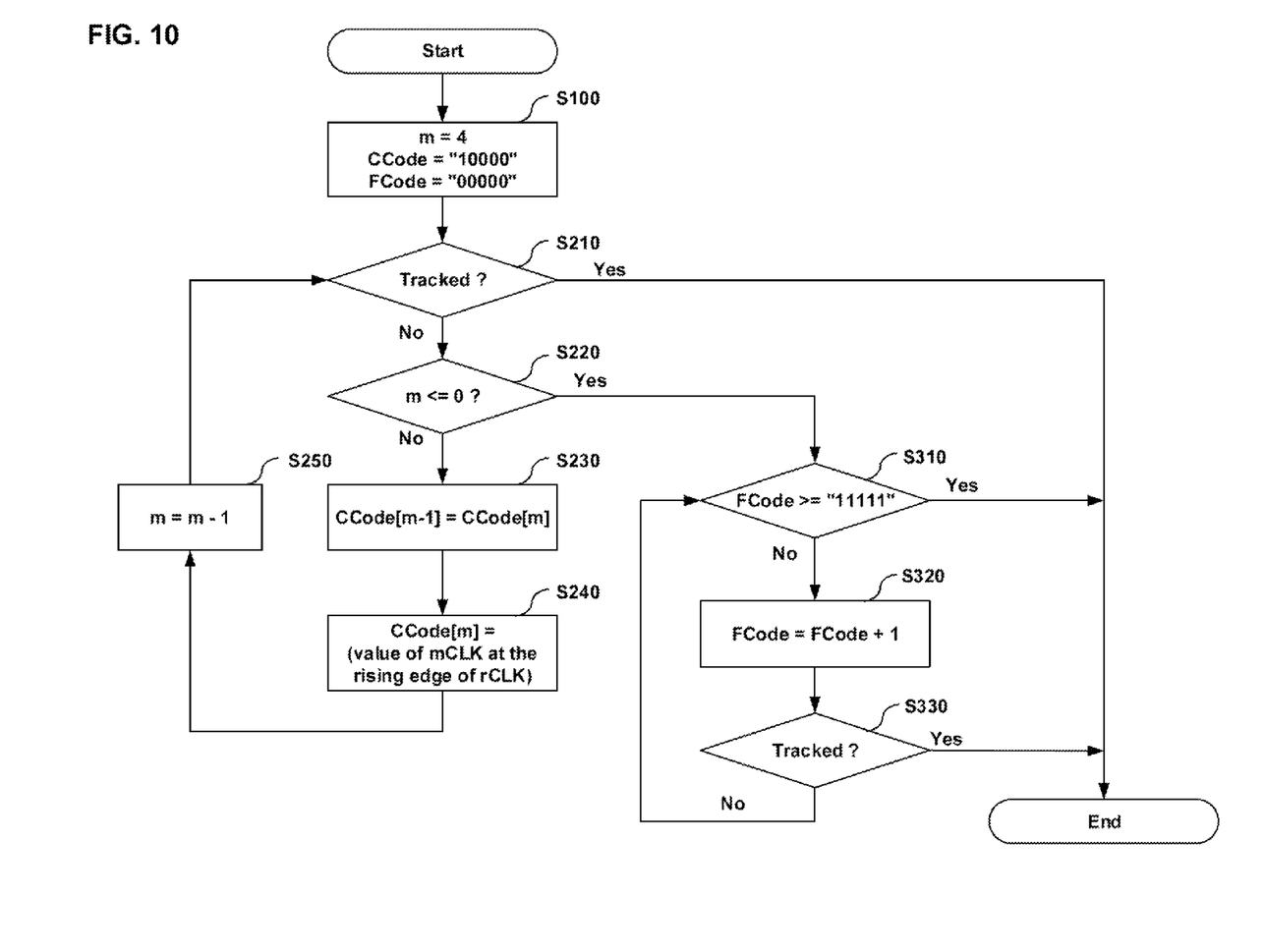
FIG. 10 is a flow chart illustrating a tracking operation of the delay locked loop shown in FIG. 2.

FIG. 10 is a flow chart illustrating a tracking operation performed by the delay locked loop shown in FIG. 2. At step S100, an index m is initialized to 4, the first delay control signal CCode is set to 10000', and the second delay control signal FCode is initialized to 00000'. The index m denotes a bit number of the first delay control signal CCode.

Then, at step S210, it is determined whether the tracking operation completes. When the tracking operation completes, the operation ends. Otherwise, at step S220 it is examined whether the index m has a same value as or a value less than '0'. When the index m has the value '0' or less, the step S310 is performed to determine the second delay control signal FCode. Otherwise, at step S230 an $m^{th}$ bit value of the first delay control signal CCode replaces an $m−1^{th}$ bit value. Then, at step S240 the $m^{th}$ bit value of the first delay control signal CCode is determined based on a value of the pulse signal mCLK at a rising edge of the output signal rCLK. Then, at step S250 the index m decreases by 1, and the operation goes back to the step S210 to repeat the subsequent steps.

At step S310, it is determined whether the second delay control signal FCode has the maximum value or above. When the second delay control signal FCode is less than the maximum value, at step S320 the second delay control signal FCode is increased by 1. Then, at step S330 it is examined whether the tracking operation completes. When the tracking operation completes, the operation ends. Otherwise, the step S310 and its subsequent steps are repeated. In another embodiment, the method of determining the first delay control signal CCode and the second delay control signal FCode can be modified in various manners.

Figure 11:
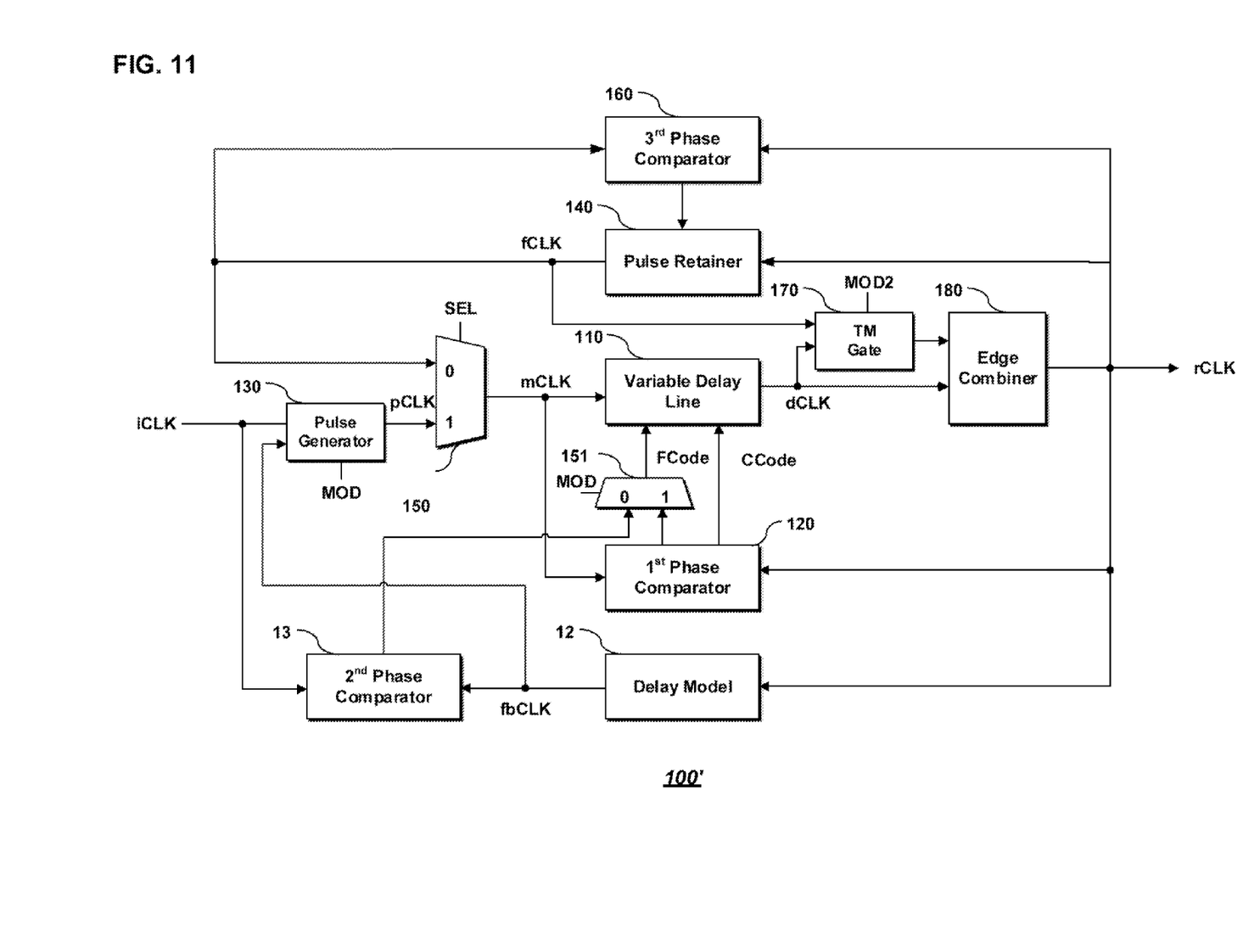
FIG. 11 is a block diagram showing a delay locked loop according to another embodiment.

FIG. 11 is a block diagram showing a delay locked loop 100' according to another embodiment. The delay locked loop 100' shown in FIG. 11 operates in the same manner as the delay locked loop 100 shown in FIG. 2 in a tracking operation mode and in a normal operation mode. The delay locked loop 100' shown in FIG. 11 may additionally perform a duty ratio control operation to control a duty ratio of the output signal rCLK. The duty ratio control operation may be performed before the tracking operation. For the duty ratio control operation, a transmission gate 170 and an edge combiner circuit 180 may be added. The transmission gate 170 selectively transmits the second feedback signal fCLK or an output signal dCLK of the variable delay line circuit 110 according to a control signal MOD2. The edge combiner circuit 180 may combine an output of the transmission gate 170 and the output signal dCLK of the variable delay line circuit 110 to generate the output signal rCLK. During the duty ratio control operation the TM gate 170 transmits the second feedback signal fCLK according to the control signal MOD2. The 3rd phase comparator circuit 160 controls amount of delay at the pulse retainer 140 during the duty ratio control operation. After the duty ratio control operation has finished, the TM gate 170 transmits the output signal dCLK of the variable delay line 110 according to the control signal MOD2.

Figure 12:
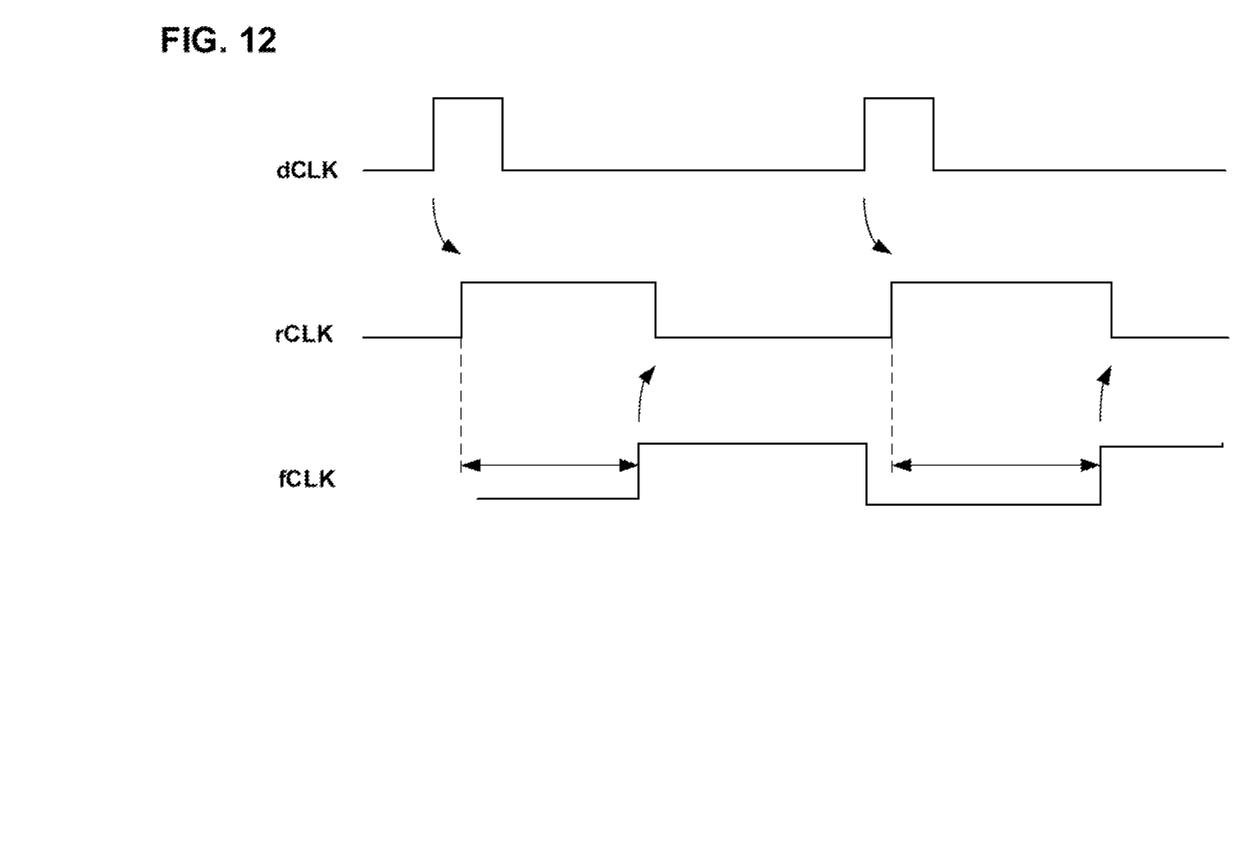
FIG. 12 is a waveform diagram illustrating an operation of a third phase comparator circuit shown in FIG. 11.

As shown in FIG. 12, the edge combiner circuit 180 is configured to form a rising edge of the output signal rCLK on a rising edge of the output signal dCLK of the variable delay line circuit 110 and configured to form a falling edge of the output signal rCLK on a rising edge of the second feedback signal fCLK which is transmitted through the transmission gate 170.

The delay locked loop 100' may further include a third phase comparator circuit 160. The third phase comparator circuit 160 may adjust the delay amount of the pulse retainer circuit 140 so that the second feedback signal fCLK and the output signal rCLK have the same phase. As described above in reference to FIG. 6, it is desirable that the delay amount tPR of the pulse retainer circuit 140 is a sum or more of the time period tSP necessary for the first phase comparator circuit 110 to update the delay control signals CCode and FCode and the time period tCA necessary to adjust the delay amount of the variable delay line circuit 110 in response to the updated delay control signals CCode and FCode.

While various embodiments have been described above, it will be understood to those skilled in the art that the embodiments described above are by way of example only. Accordingly, the device and method described herein should not be limited based on the described embodiments.

What is claimed is:
1. A delay locked loop for locking a delay between an input signal and an output signal, comprising:
a variable delay line circuit configured to delay a pulse selection circuit output to generate the output signal;
a delay model circuit configured to delay the output signal to generate a first feedback signal;
a first phase comparator circuit configured to control a delay amount of the variable delay line circuit depending on a phase difference between the input signal and the first feedback signal;
a pulse generation circuit configured to generate a pulse signal in response to the input signal and the first feedback signal during a tracking operation;
a pulse retainer circuit configured to delay the output signal to generate a second feedback signal during the tracking operation;
a pulse selection circuit configured to select the pulse signal generated by the pulse generation circuit or the second feedback signal as the pulse selection circuit output during the tracking operation; and
a second phase comparator circuit configured to generate a delay control signal to control the delay amount of the variable delay line circuit depending on a phase difference between the pulse selection circuit output and the output signal during the tracking operation.

2. The delay locked loop of claim 1,
wherein a pulse width of the pulse signal is a sum of (i) the phase difference between the first feedback signal and the input signal and (ii) an initial delay amount of the variable delay line circuit.

3. The delay locked loop of claim 2,
wherein the pulse generation circuit forms a rising edge of the pulse signal according to a rising edge of the first feedback signal and forms a falling edge of the pulse signal according to a point of time which is determined by delaying a rising edge of the input signal by the initial delay amount of the variable delay line circuit.

4. The delay locked loop of claim 3,
wherein, after completion of the tracking operation, the pulse generation circuit generates the pulse signal having substantially the same waveform as the input signal.

5. The delay locked loop of claim 4,
wherein, after completion of the tracking operation, the pulse selection circuit selects an output of the pulse generation circuit as the pulse selection circuit output.

6. The delay locked loop of claim 1,
wherein the pulse selection circuit selects an output of the pulse generation circuit shortly after the pulse signal is generated by the pulse generation circuit, and
wherein the pulse selection circuit selects the second feedback signal when the pulse signal is subject to feedback of the first feedback signal.

7. The delay locked loop of claim 1,
wherein the second phase comparator completes the tracking operation when a falling edge of the pulse selection circuit output is aligned to a rising edge of the output signal.

8. The delay locked loop of claim 1,
wherein the variable delay line circuit comprises a first variable delay line circuit and a second variable delay line circuit,
wherein the second phase comparator circuit controls delay amounts of the first variable delay line circuit and the second delay line circuit during the tracking operation, and
wherein the first phase comparator circuit controls a delay amount of the second variable delay line circuit after the tracking operation completes.

9. The delay locked loop of claim 1,
wherein a delay amount of the pulse retainer circuit is the same as or more than a sum of (i) a time period necessary for the second phase comparator circuit to update the delay control signal and (ii) a time period necessary to update the delay amount of the variable delay line circuit in response to the updated delay control signal.

10. The delay locked loop of claim 9, wherein the delay amount of the pulse retainer circuit is less than a delay amount of the delay model circuit.

11. The delay locked loop of claim 1, further comprising:
a duty ratio control circuit configured to control a duty ratio of a signal generated by the variable delay line circuit to provide the duty ratio controlled signal as the output signal.

12. The delay locked loop of claim 11, wherein the duty ratio control circuit comprises:
an edge combiner circuit configured to combine the second feedback signal output from the pulse retainer circuit and the signal generated by the variable delay line circuit to generate the output signal; and
a third phase comparator circuit configured to control a delay amount of the pulse retainer circuit depending on a phase difference between the output signal and the second feedback signal.

13. The delay locked loop of claim 12, wherein the edge combiner circuit generates the output signal having a rising edge according to a rising edge of the signal generated by the variable delay line circuit and having a falling edge according to a rising edge of the second feedback signal.

\* \* \* \* \*